United States Patent [19]

Seidler

[11] Patent Number: 5,571,034
[45] Date of Patent: Nov. 5, 1996

[54] METHOD OF MAKING AN ARRAY OF ELECTRICAL COMPONENTS WITH LEADS ATTACHED AND THE PRODUCT THEREOF

[75] Inventor: Jack Seidler, Flushing, N.Y.

[73] Assignee: North American Specialties Corporation, Flushing, N.Y.

[21] Appl. No.: 375,970

[22] Filed: Jan. 20, 1995

[51] Int. Cl.$^6$ .................................................. H01R 4/02
[52] U.S. Cl. .............................. 439/876; 439/885; 29/843
[58] Field of Search ........................... 439/876, 83, 885; 29/843, 854, 884

[56] References Cited

U.S. PATENT DOCUMENTS

| | | | |
|---|---|---|---|
| 4,120,558 | 10/1978 | Seidler | 439/876 |
| 4,203,648 | 5/1980 | Seidler | 439/876 |
| 4,592,617 | 6/1986 | Seidler | 439/876 |
| 4,597,628 | 7/1986 | Seidler | 439/876 |
| 4,605,278 | 8/1986 | Seidler | 439/876 |
| 4,679,889 | 7/1987 | Seidler | 439/876 |
| 4,728,305 | 3/1988 | Seidler | 439/876 |
| 4,737,115 | 4/1988 | Seidler | 439/876 |
| 4,738,627 | 4/1988 | Seidler | 439/876 |
| 4,780,098 | 10/1988 | Seidler | 439/876 |
| 5,090,926 | 2/1992 | Seidler | 439/876 |
| 5,441,429 | 8/1995 | Seidler | 439/876 |
| 5,441,430 | 8/1995 | Seidler | 439/876 |

*Primary Examiner*—Gary F. Paumen
*Attorney, Agent, or Firm*—Darby & Darby, P.C.

[57] ABSTRACT

A method of making an array of electrical components having pre-attached leads ready for automated surface-mounting on a substrate. The method involves aligning an array of leads with electrical components and attaching each lead to a conductive terminal on a respective component. A series or coil of leads joined integrally together and carried by a carrier strip is thus provided with a series of electrical components pre-attached thereto. The electrical components along with their leads may thus be quickly and easily surface-connected to the conductive pads on a substrate in a simple, automated manner.

12 Claims, 6 Drawing Sheets

METHOD OF MAKING AN ARRAY OF ELECTRICAL COMPONENTS WITH LEADS ATTACHED AND THE PRODUCT THEREOF

BACKGROUND OF THE INVENTION

The present invention relates to assemblies of solder-bearing terminal elements or leads and electrical components for assembly with printed circuit boards or other substrates, and to methods of fabricating such terminal elements or leads and attaching them to electrical components.

In the electronic equipment industry, an important necessity is the rapid and accurate assembly of electrical circuit components such as resistors, capacitors, integrated circuit chips, and chip carriers with printed circuit boards or other substrates. For connecting such components to substrates, leads are necessary. It has previously been suggested to facilitate the connection of such leads to components or to substrates by securing a solder slug or mass to the lead. When positioned in engagement with a circuit board and heated, the molten solder will cover the adjacent surfaces of both elements to form, when cooled, a soldered joint providing both a mechanical coupling and an electrical connection between the elements. Various exemplary arrangements of arrays of leads with solder-holding elements for automated assembly are disclosed in Seidler U.S. Pat. Nos. 4,120,558, 4,203,648, 4,679,889, 4,728,305, and 4,780,098, which patents are hereby incorporated by reference. The last three patents are specifically directed to solder-holding leads that allow for very close spacing of the leads from which they are formed.

To attain greater miniaturization in this field, size of and spacing between conductive terminals for surface-mounting electrical components on printed circuit boards, for example, have been reduced. Thus, it has become desirable to provide for automated connection of electrical components, such as resistors, capacitors, integrated circuit chips, and chip carriers, to circuit boards. The increasing demands for miniaturization have also further complicated the connection of leads to the components to complete the connection of the components to the circuit boards. Thus, the operation of connecting leads to their circuit elements has been time consuming and has slowed down the process of assembling finished circuit boards ready for use in a particular electrical device.

SUMMARY OF THE INVENTION

It is therefore a principal object of the present invention to provide an array of electrical components having pre-attached leads ready for automated surface-mounting on a substrate. The components with such attached leads may be automatically attached to a circuit board, or other substrate, by soldering of the leads to the circuit board or other substrate. The leads are formed by stamping a continuous strip of metal (such as brass or beryllium copper) at high speed in progressive stamping machines. The strip is stamped progressively to form leads extending laterally from a continuous portion of the strip forming a carrier for the leads. The carrier strip is formed with indexing holes for accurately indexing the strip so that the leads may be accurately positioned in the successive stages of the stamping machine. Each lead is provided with at least two solder masses—one for connection of the lead to an electrical component and the other for connection to the substrate. As part of or an extension of the lead stamping process, the components are attached to the leads of the continuous array of leads supported by a carrier strip at the end of the stamping process to form a continuous array or coil of integrally joined leads each carrying an electrical component and supported by the carrier strip. Each combination of lead and component may thereafter be surface-mounted to a substrate by automated equipment.

The present invention accordingly comprises an article of manufacture and method of fabrication possessing the features, properties and relation of elements exemplified in the embodiments described in the following detailed description and the accompanying drawings, the scope of the invention being set out in the appended claims.

DESCRIPTION OF PREFERRED EMBODIMENTS

In conventional practice, substrates (such as a printed circuit board, integrated circuit, chip carrier or the like) carry closely spaced electrical circuits in the form of conductive strips which terminate in conductive areas or terminals known as contact pads. Such contact pads are usually closely spaced along one or more edges of the substrate on centers which may be as small as 0.100 or 0.050 inches apart. Such circuits and pads may be on only one side of the substrate or on both the top and bottom surfaces, although not necessarily opposite one another. Leads, such as edge clips, are electrically connected to respective contact pads such as by soldering. It is conventional practice to engage a set of such leads simultaneously with a number of contact pads. To do so, the leads must be retained with a fixed uniform spacing matching the spacing of the contact pads. Conventionally this has been done by keeping the leads integrally joined to a carrier strip formed from the strip material from which the leads are formed by progressive multi-stage stamping. A portion of the carrier strip with the appropriate number of leads is then juxtaposed to the substrate, with the solder carried by each lead in engagement with a respective contact pad. After heating or reflow of the solder, each lead becomes joined electrically and mechanically to a respective contact pad of the substrate. Once the leads are connected to the substrate, the carrier strip typically is broken off so that the ends of the leads form terminals ready for use. Conventionally, electrical components are thereafter connected to the leads.

The present invention provides an automated method of surface-connecting electrical components to the conductive pads on a substrate by assembling the components to the leads before mounting the leads on the substrate. The present invention thus provides a series of electrical components preattached to a series or coil of leads joined integrally together and carried by a carrier strip.

Figure 1:
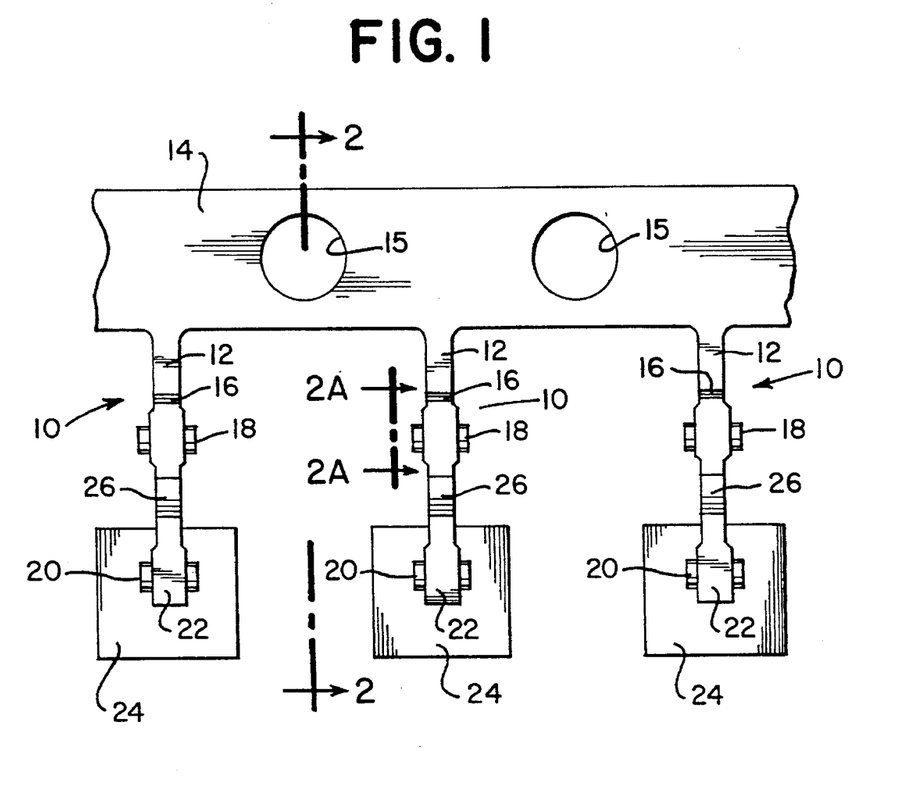
FIG. 1 is a plan fragmentary view of a section of a series of components carried by a continuous array of leads joined to a common carrier strip according to the present invention.

A plan view of a section of a continuous array of leads 10 used in the present invention is shown in FIG. 1. Each lead 10 is carried at its first end 12 by the same carrier strip 14. Carrier strip 14 is provided with a series of sprocket or indexing holes 16 for indexing carrier strip 14 and thereby leads 10 step-by-step through the manufacturing assembly line, as will be described in further detail below. Each lead 10 has a first solder arrangement 18 adjacent its first end 12, proximal to carrier strip 14, and a second solder arrangement 20 adjacent its second end 22, distal from carrier strip 14. An electrical component 24 is attached (soldered) to lead 10 by second solder arrangement 20 at a conductive terminal or contact pad 25 on the component 24, leaving first solder arrangement 18 free for connection to a substrate. Component 24 may be any desired electrical component, such as a resistor, capacitor, integrated circuit, or chip carrier, that may be surface-connected to a substrate for forming an electrical circuit. The solder arrangements 18 and 20 are sufficiently spaced from each other for proper connection of lead 10 both to a substrate at one end and to an electrical component at the other end. Additionally, solder arrangements 18 and 20 are offset by a bend 26 in lead 10, bend 26 being more readily apparent in FIG. 2. A weakened area 16 is provided at the first end 12 of each lead 10 so that carrier strip 14 may be broken off after connection of the leads 10 to a substrate.

Figure 2:
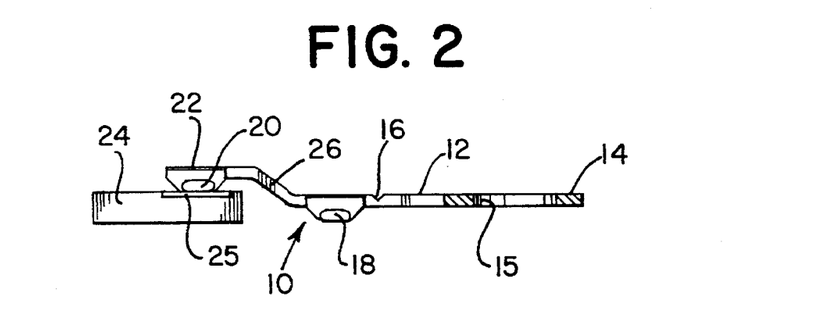
FIG. 2 is a cross-sectional elevation view of the arrangement of FIG. 1, viewed along line 2—2 thereof, showing a solder mass positioned on each lead.

A side and partially cross-sectional view along line 2—2 of the arrangement of FIG. 1 is shown in FIG. 2. Because leads 10 and connected components 24 are intended to be surface-mounted to a substrate, solder arrangement 20 with component 24 is offset from solder arrangement 18 by bend 26. Thus, when solder arrangement 18 is joined to a substrate, component 24, joined to second, distal end 22 of lead 10, is properly positioned above and on the surface of the substrate and in proper position for completion of the assembly of component 24 with the substrate where needed.

Figure 2A:
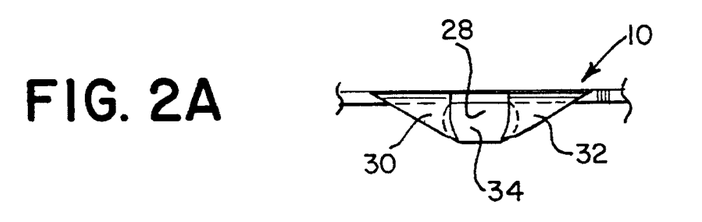
FIG. 2A is an enlarged fragmentary elevation view of a solder-bearing portion of a lead, viewed along line 2A—2A of FIG. 1.

FIG. 2A is an enlarged fragmentary elevation view, along line 2A—2A in FIG. 1, of one form of solder retention on the lead, useful in the present invention. Lead 10 has a channel 28 whose "floor" is formed by the main body of lead 10 and whose sides are formed from tabs 30 and 32 formed on each side of lead 10, as will be described in further detail below. A solder mass 34 is laid between tabs 30 and 32. Typically, solder mass 34 initially is part of a solder wire which is laid across lead 10 and cut at an appropriate distance from tabs 30, 32 to supply the desired amount of solder for the soldering operation and to leave separate solder masses 34 on each lead 10. Preferably, as shown, solder mass 34 is pushed into channel 28 to nearly fill channel 28, and to offer a lower profile so that on juxtaposition to a contact pad on a substrate, tabs 30 and 32 will be in contact with the substrate contact pad, thereby improving the reliability of the soldering. Additionally, tabs 30 and 32 preferably are pushed into solder mass 34 to more firmly secure solder mass 34 in channel 28. The formation of solder arrangement 18 is described in further detail in aforementioned U.S. Pat. No. 4,679,889.

Figure 3:
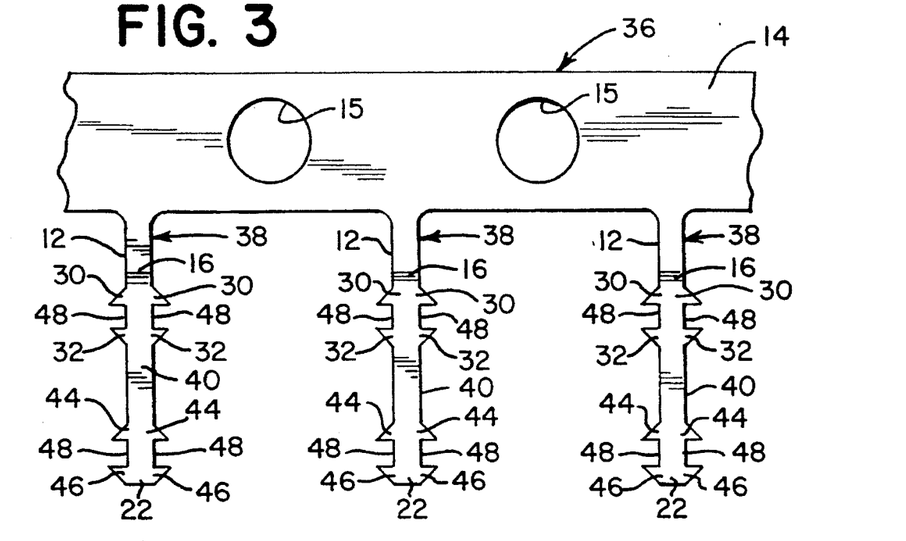
FIG. 3 is a plan view of a partly formed blank used in forming the leads for use in the present invention.

The formation of the array of leads with attached components according to the present invention is depicted in FIGS. 3–5A. First, a stamped strip 36 is formed having a sequence of individual lead blanks 38 joined to a carrier strip 14, as shown in FIG. 3.

Lead blanks 38 are formed into the leads 10 of the present invention. The original strip is formed of a conductive material such as beryllium copper or like resilient and conductive material. Each lead blank 38 has an elongated body section 40 of length appropriate for attaching an electrical component to a substrate. A tab 30 and a tab 32, each in the form of a sloping extension with a gap 42 therebetween, extends from each lateral edge of body section 40 adjacent carrier strip 14 and first end 12 of the leads. Tabs 30 are closer to carrier strip 14 than are tabs 32. In order to form channel 28, in which solder mass 34 is laid, tabs 30 and 32 are bent out of the plane of body section 40 into a position substantially perpendicular to the plane of body section 40, such as shown in FIG. 2A.

A second set of tabs 44 and 46, each in the form of a sloping extension with a gap 48 therebetween, extends from each lateral edge of body section 40 at second end 22. Tabs 44 are closer to carrier strip 14 than are tabs 46. Tabs 44 and 46 are spaced apart a sufficient distance from tabs 30, 32 so that a component can be attached at the former set of tabs without interfering with a later connection to be made at the latter set of tabs. In order to form solder arrangement 20, tabs 44 and 46 are bent out of the plane of body section 40 into a position substantially perpendicular to the plane of body section 40, thereby forming a channel in which solder is to be laid. Gaps 42 and 48 are dimensioned to have a width substantially equal to the diameter of a solder wire to be laid therein, and a depth dimension somewhat less than the solder wire diameter. It will be understood that the tabs may be of any desirable shape, preferably having straight edges extending transversely of the lead body to form gaps for forming channels in which solder is laid. Body section 40 also includes notches 16 (also shown in FIGS. 1 and 2), adjacent first end 12, for breaking off carrier strip 14 from leads 10 when the leads 10 are connected to a substrate.

Figure 4:
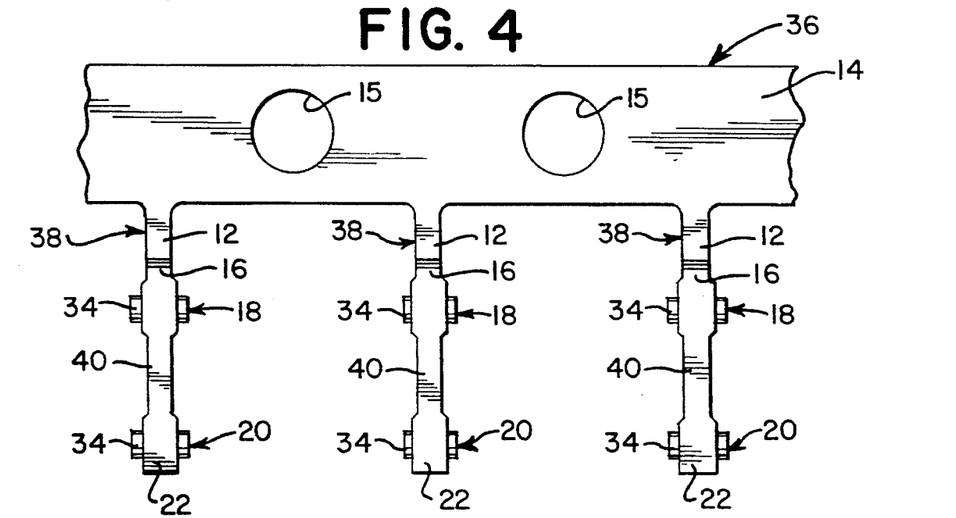
FIG. 4 is a plan view of the blank of FIG. 3 but with solder masses jointed thereto.

As shown in FIG. 4, once tabs 30, 32, 44, and 46 are bent perpendicularly to body section 40, a solder mass 34 may be laid in the channels formed between the pairs of tabs. Solder arrangements 18 and 20 are thereby ready for attachment to a substrate or component, respectively. Solder arrangement 18 is sufficiently far from solder arrangement 20 to be joined to a substrate without interference by a component.

Figure 5:
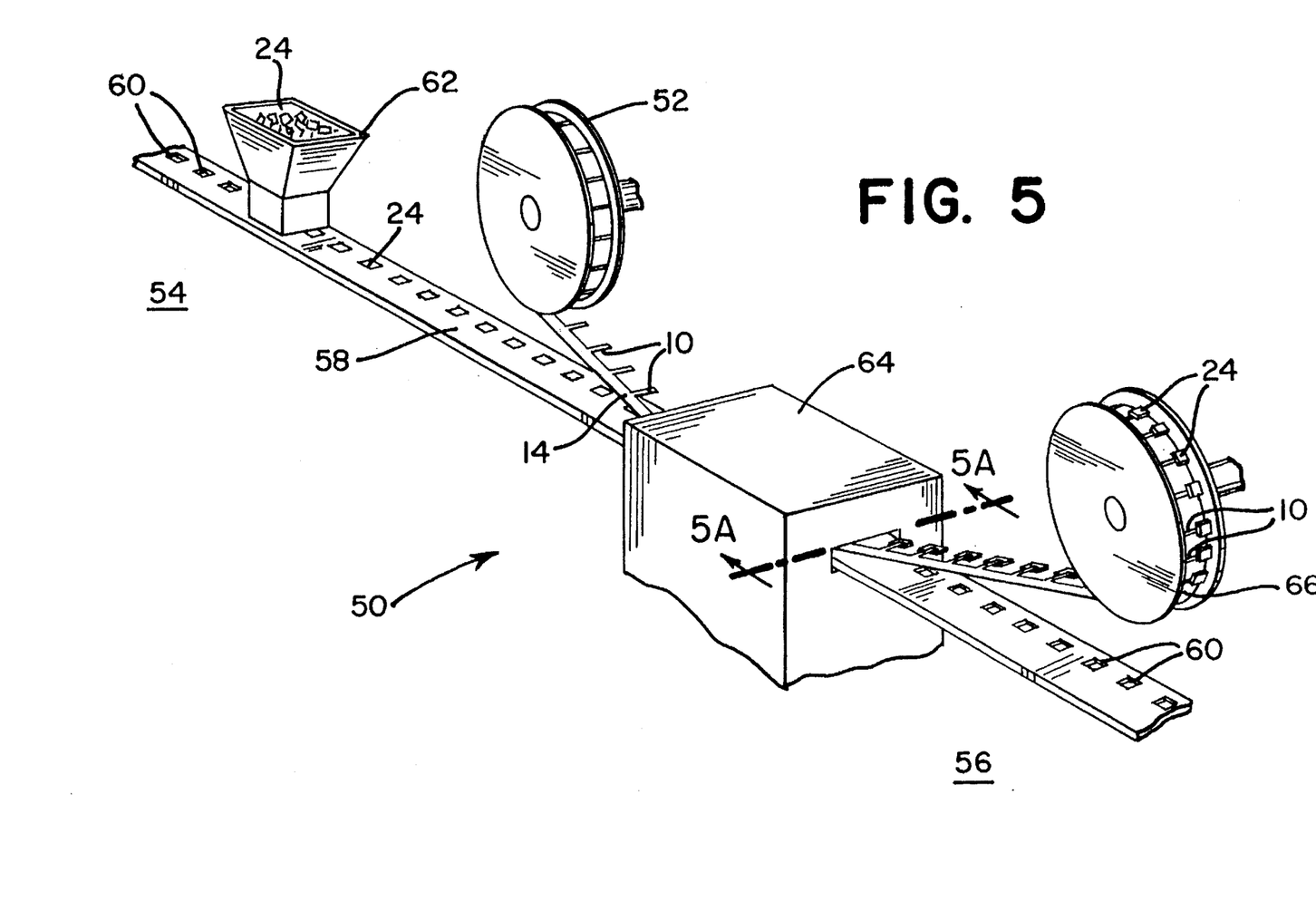
FIG. 5 is a schematic perspective view of a portion of an automated assembly line for manufacturing leads on which electrical components are attached, showing the stage of manufacture at which the leads and components are joined.
Figure 5A:
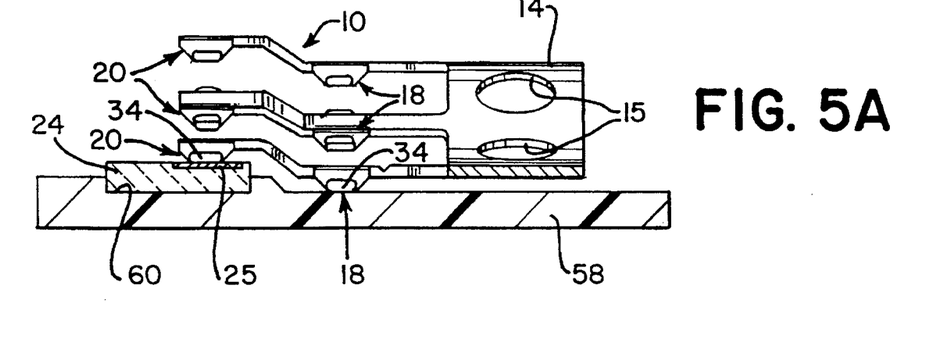
FIG. 5A is a cross-sectional view, along line 5A—5A of FIG. 5, showing the joining of a lead to an electrical component.

An assembly station 50 in a manufacturing assembly line for joining the leads to components according to the present invention is shown in FIG. 5, with a cross-sectional view in FIG. 5A. A coil 52 of a carrier strip 14 carrying multiple leads 10 (or the strip of formed leads exiting from the multi-stage stamping equipment) is located at an upstream position 54 of station 50. Carrier strip 14 is progressively indexed toward downstream position 56 by means of its sprocket or indexing holes (not shown; see FIGS. 4 and 5A). A conveyor 58 is also progressively indexed, at the same speed as carrier strip 14, toward downstream position 56. Conveyor 58 has holders 60 shaped and dimensioned to carry components 24 suitably fed into holders 60, as by hopper 62. Holders 60 are spaced apart the same distance as leads 10 are spaced apart along carrier strip 14, thus allowing for each lead 10 to be aligned with a respective holder 60. Because carrier strip 14 and conveyor 58 advance at the same speed, alignment between leads 10 and components 24 is maintained throughout assembly station 50.

Connection of the terminals of a component 24 to a lead 10 is accomplished at sub-station 64 in station 50, as shown in FIG. 5A (a view along line 5A—5A in FIG. 5). Carrier strip 14 curves downward as it moves from upstream position 54 toward downstream position 56, as may be easily seen in FIG. 5. Thus, carrier strip 14 is shown in FIG. 5A as extending downwards and forwards, toward downstream position 56.

Within sub-station 64, carrier strip 14 is lowered to be positioned immediately above conveyor 58. Holders 60 are raised slightly above the upper surface of conveyor 58 to accommodate for the offset positions of solder arrangements 18 and 20. Thus, solder arrangement 18 rests above conveyor 58 and solder arrangement 20 rests above component 24. Solder mass 34 in solder arrangement 20 is in direct contact with a terminal or contact pad 25 on the upper surface of component 24. Heat is applied in a conventional manner to heat solder mass 34 to bond to contact pad 25 on component 24. Thus, carrier strip 14 exits sub-station 64 with components 24 attached to leads 10 joined to carrier strip 14, as may be seen in FIG. 5. The resultant strip of leads and components is wound into coil 66 at the downstream position 56 of station 50.

Figure 6:
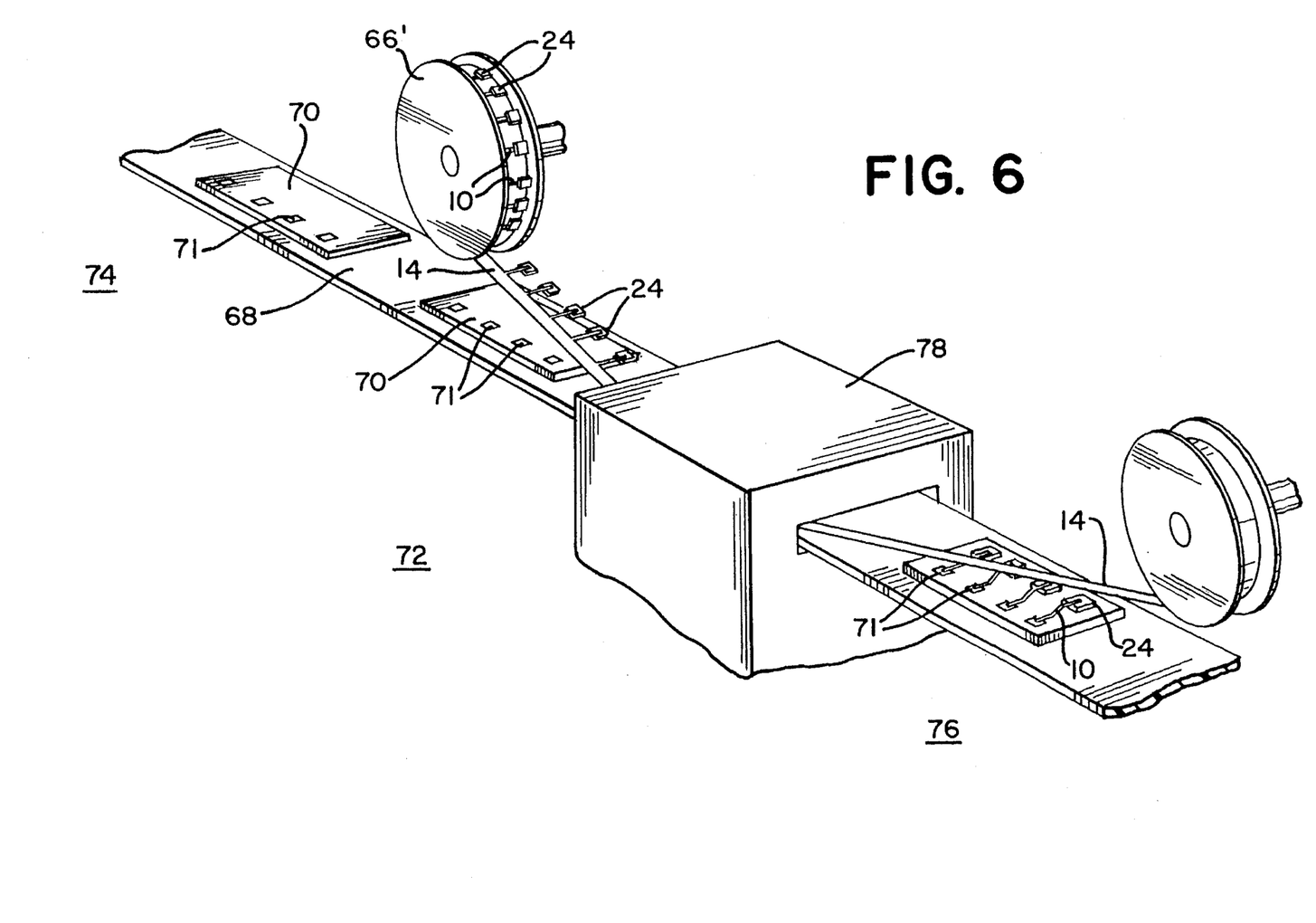
FIG. 6 is a schematic perspective view of a portion of an automated assembly line for the connection of a series of electrical components, to which at least one lead has been attached, to a respective substrate.

FIG. 6 shows how components, with their pre-attached leads, may be connected to respective substrates, in a manner similar to that shown in FIG. 5. Thus, a conveyor 68 carries substrates 70 through station 72 from an upstream position 74 to a downstream position 76 at the same speed as carrier strip 14 is indexed off of coil 66' in the same downstream direction. Solder arrangements 18 are aligned with and positioned over contact pads 71. Within sub-station 78, solder arrangements 18 and contact pads 71 come in contact and are bonded through an application of heat that reflows the solder. Carrier strip 14 then is disconnected from leads 10 by breaking apart the two along weakened area 16. Thus, carrier strip 14 exits sub-station 78 without leads 10 or components 24, and substrates 70 exit sub-station 78 with leads 10 and components 24 attached to respective contact pads 71 thereon.

Figure 7:
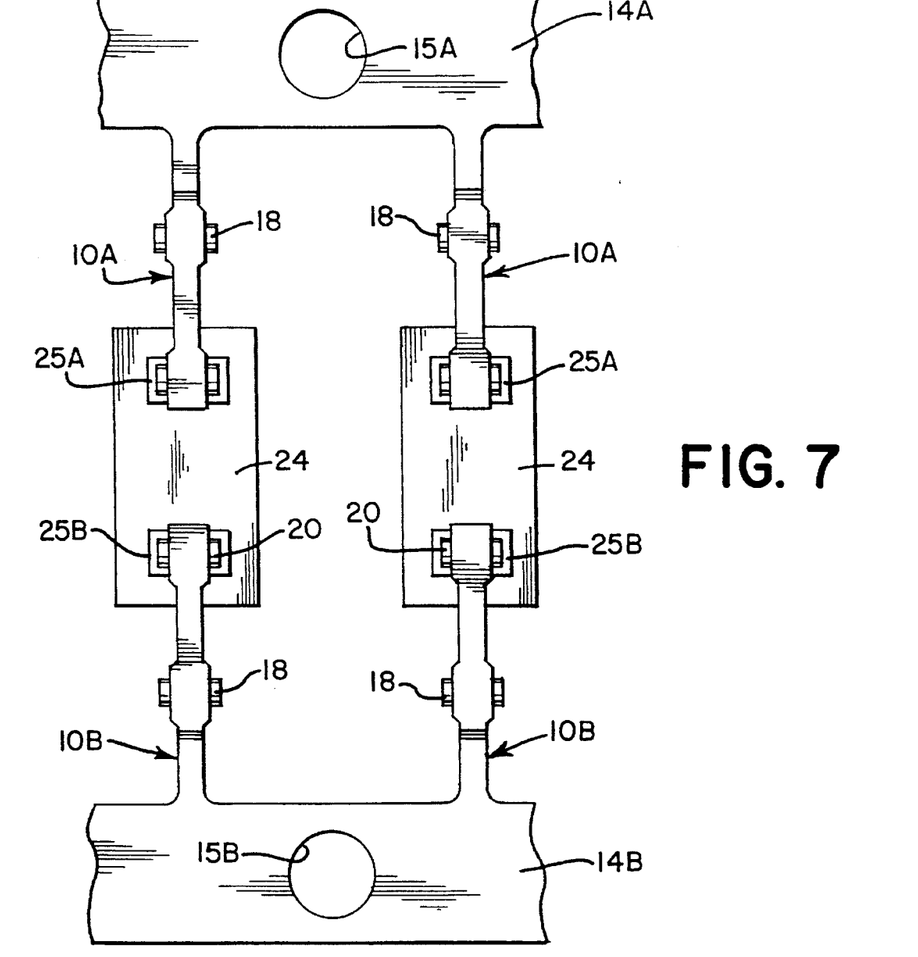
FIG. 7 shows a plan view of a portion of an array of electrical components to each of which two leads have been attached, the leads extending from opposite ends of the component and supported by respective carrier strips.

In some circumstances, it may be desirable to provide preassembled components with two or more leads. FIG. 7 shows a more advanced embodiment of the present invention, with a continuous array or coil of interconnected components 24 attached to leads 10A and 10B, joined by carrier strips 14A and 14B, respectively, extending from opposite sides of each component 24. Each component 24 has two contact pads 25A and 25B on opposite ends. To each contact pad is joined a lead 10A, 10B, respectively, via a solder arrangement 18 on the lead 10A, 10B, in accordance with the principles of the present invention set forth above. Thus, two parallel carrier strips 14A and 14B, from and between which leads 10A and 10B extend, are joined via connections of the leads 10A, 10B to the contact pads 25A and 25B of components 24. As shown in the isometric view of FIG. 8, each component 24 carrying a lead 10 at each end (joined to a respective component contact pad 25) may be placed over a substrate 70 and connected to substrate 70 by joining solder arrangements 18 on the leads 10 to contact pads 71 on the substrate 70.

Figure 8:
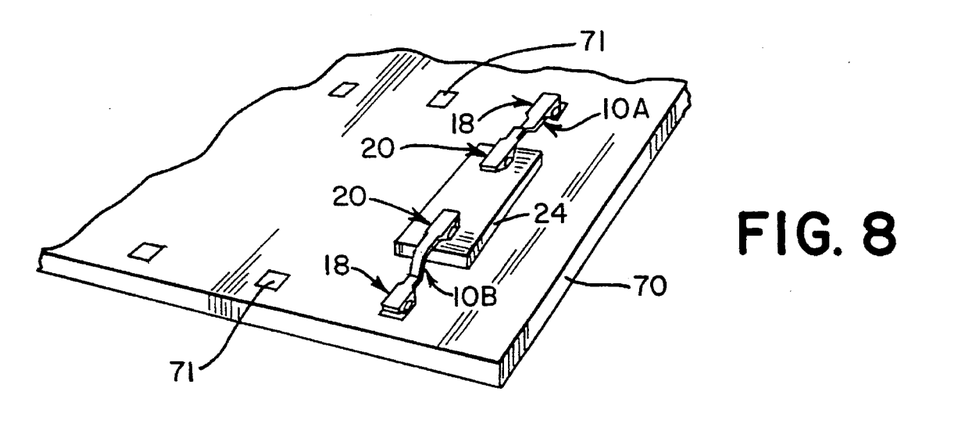
FIG. 8 is an isometric view of an illustrative lead and component assembly of FIG. 7 as assembled on a substrate.

The final configuration of a two-terminal component 24 connected to a substrate 70 in accordance with the principles of the present invention is shown in FIG. 8. If only a single array of leads with pre-attached components is used, as in FIGS. 1–5A, a second lead is desirably joined to component 24 to complete the electrical connection of component 24 to substrate 70. Such a second lead may be provided on a separate array of leads carried by a second carrier strip and connected to component 24, after it is surface-mounted on substrate 70 via a pre-attached lead. If an array of components with two pre-attached leads is provided, such as shown in FIG. 7, then each requisite component 24 carrying a pair of leads may be placed on the substrate 70 and connected to the substrate by joining the solder arrangements 18 on the two leads to respective pads 71 on the substrate 70.

Figure 9:
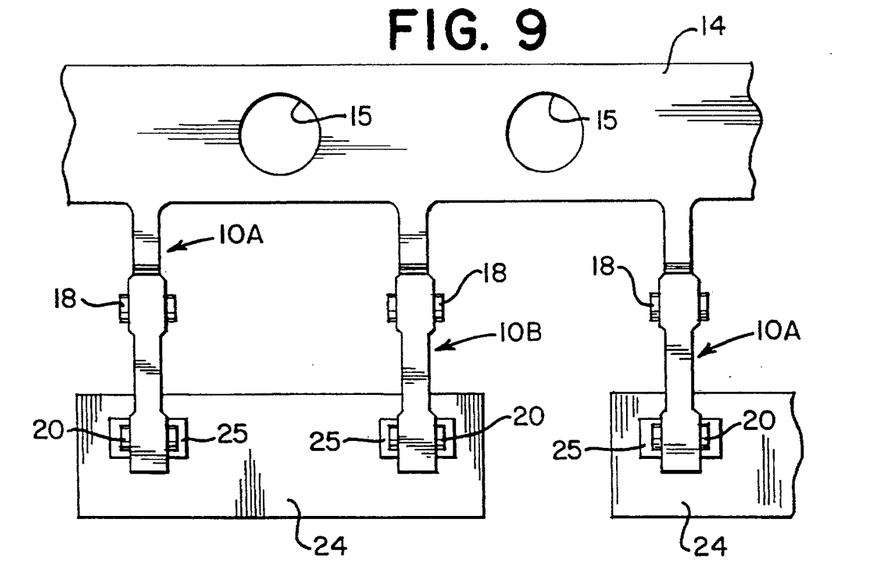
FIG. 9 shows a plan view of a portion of an array of electrical components to each of which two leads of the same lead array have been attached, the leads extending side by side from the component and being supported by the same carrier strip.

Instead of using two separate series of leads joined to two opposing contact pads of the component, a single series of leads may be used, with two adjacent leads of the series joined to the two contact pads of the component, as shown in FIG. 9. The spacing between each pair of leads 10 is coordinated to the spacing of the pair of contact pads 25 of the component 24. Thus, a carrier strip 14 is formed having components 24 each pre-attached to two leads 10A and 10B and therefore ready for being electrically connected to a substrate.

Figures 10, 11:
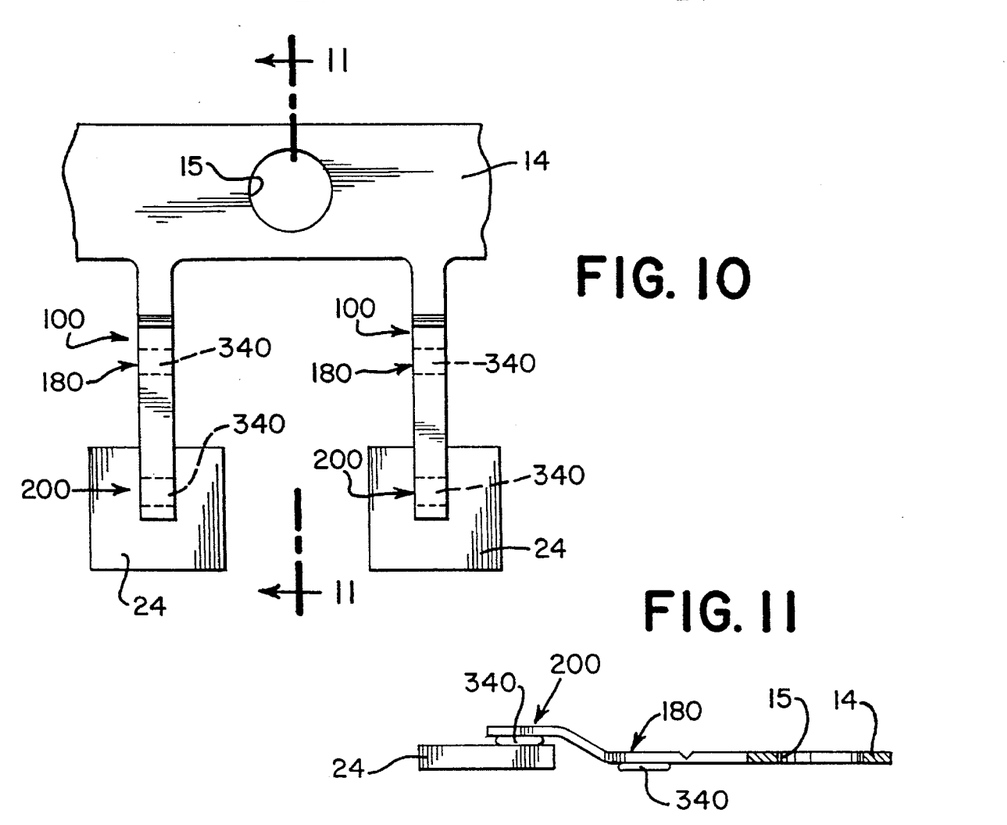
FIG. 10 is a plan view of a section of a continuous array of leads joined to a carrier strip and having a modified form of solder arrangement, each lead being joined to a respective electrical component.
FIG. 11 is a cross-sectional elevation view of a part of the arrangement of FIG. 10, viewed along line 11—11 thereof, showing the solder bands positioned on the lead.

While the solder arrangements 18, 20 are illustrated by use of tabs 30, 32, 44, 46, the solder arrangements of the present invention may have other configurations than that shown in the above-described figures. For example, as shown in FIGS. 10 and 11, a band of solder 340 may be provided on predetermined areas of the leads 100 to form solder arrangements 180 and 200, such as described in Seidler U.S. Pat. No. 5,090,926 hereby incorporated by reference. As may be understood from FIG. 11, this type of solder arrangement allows for a closer relation of lead 10 to both component 24 and the substrate.

While the foregoing are preferable modes of forming assemblies of leads with pre-attached electrical components, other configurations are possible. For example, other solder arrangements than those shown may be used to join the components to the leads. Moreover, the arrangement of the components on the leads may vary from those arrangements shown, as determined by the layout of the substrate to which the components with pre-attached leads are to be electrically connected.

From the foregoing description, it will be clear that the present invention may be embodied in other specific forms without departing from the spirit or essential characteristics thereof. The presently disclosed embodiments are therefore to be considered in all respects as illustrative and not restrictive, the scope of the invention being indicated by the appended claims, and not limited to the foregoing description.

What is claimed in the invention is:

1. A method of automating the assembly of electrical components to substrates, comprising:

providing a continuous carrier strip of electrically conductive material, with a plurality of parallel leads integrally joined to said carrier strip in predetermined spaced relation, each of said leads extending transversely of said carrier strip and having a first, proximal end adjacent said carrier strip and a second, distal end remote from said carrier strip, each said lead having first and second solder arrangements adjacent respectively to said first and second lead ends, providing a series of electrical components each having a conductive terminal, successively soldering each component terminal to a respective lead at one of said solder arrangements, while retaining said leads joined to said carrier strip, to form a continuous array of leads each joined to a respective component.

2. A method as in claim 1, further including the steps of:

providing a succession of substrates, each having a conductive pad to which it is desired to connect one of said components, successively joining a lead at the other of said solder positions to a respective substrate conductive pad, and thereafter severing said lead from said carrier strip to leave said component joined to said substrate electrically and mechanically by said lead.

3. A method as in claim 1, said solder positions of each lead being displaced transversely from each other by substantially the thickness of said component, whereby said lead and component assembly may be surface-mounted on said substrate by soldering said lead to said substrate at said other solder position.

4. A method as in claim 1 wherein each component has a second conductive terminal, said method further including the steps of:

providing a second continuous array of conductive leads, each lead integrally joined to a continuous second carrier strip, and each lead of said second array having first and second solder masses thereon at respective first and second spaced solder positions therealong, and successively joining each second conductive terminal of each component to a respective lead of said second array while retaining said second array of leads joined to said second carrier strip.

5. A method as in claim 1 wherein each component has a second conductive terminal, said method further including the steps of:

joining said component terminal to only one of said leads, and joining said second component terminal to a remaining one of said leads.

6. A method of automating the assembly of electrical components to a substrate comprising:

progressively stamping a continuous web of electrically conductive material to form an array of parallel elongated leads each integrally joined to a portion of said web constituting a carrier strip, causing each lead to have first and second solder masses joined thereto at respective first and second spaced solder positions on said lead, providing a series of electrical components, each having a conductive terminal, juxtaposing each said component terminal to a respective first solder mass while retaining said leads joined to said carrier strip portion and reflowing said first solder mass to form a continuous array of leads, each joined to a respective component, providing a series of substrates each having a conductive pad to which it is desired to connect one said component, soldering said second solder mass of each lead to a respective substrate conductive pad while retaining said lead joined to said carrier strip, and thereafter severing said lead from its carrier strip.

7. An array of leads assembled with electronic components for automated assembly of electrical components to substrates, comprising:

a continuous carrier strip of electrically conductive material, a plurality of parallel leads integrally joined to said carrier strip in predetermined spaced relation, each of said leads extending transversely of said carrier strip and having a first, proximal end adjacent said carrier strip and a second, distal end remote from said carrier strip, first and second solder arrangements on each lead adjacent respectively to said first and second lead ends, an electrical component having first and second opposed faces, and said component having a respective conductive terminal on said first face electrically and mechanically joined to each said second solder arrangement, and each said first solder arrangement being substantially coplanar with a respective one of said second component faces.

8. An array as in claim 7, said component terminal being joined to only one of said leads, said component having a second terminal joined to a remaining one of said leads.

9. An array as in claim 7, wherein each said component has a second conductive terminal, said array further comprising:

a second continuous carrier strip, and a plurality of second parallel leads integrally joined to said second carrier strip in said predetermined spaced relation, each of said second leads having a first, proximal end adjacent said second carrier strip and a second, distal end remote from said second carrier strip, each of said second leads having first and second solder arrangements adjacent respectively to said second lead first and second ends, and each said electrical component second terminal being joined to a respective said second lead second solder arrangement.

10. An array as in claim 9, wherein the first solder arrangements of said first and second leads are in a first plane and the second solder arrangements of said first and second leads are in a second plane displaced above said second plane such that said components can be joined to said second solder arrangements and surface-mounted to a substrate.

11. An array of leads assembled with electronic components for automated assembly of electrical components to substrates, comprising:

a continuous carrier strip of electrically conductive material, a plurality of parallel leads integrally joined to said carrier strip in predetermined spaced relation, each of said leads extending transversely of said carrier strip and having a first, proximal end adjacent said carrier strip and a second, distal end remote from said carrier strip, first and second solder arrangements on each lead adjacent respectively to said first and second lead ends, said solder arrangements of each said lead are in respective parallel displaced planes, said solder arrangements of each said lead are horizontally offset with respect to a perpendicular axis drawn through said parallel displaced planes, and an electrical component having a respective conductive terminal electrically and mechanically joined to each said second solder arrangement.

12. An array of leads adapted to be assembled with electronic components for automated assembly of electrical components to substrates, comprising:

a continuous carrier strip of electrically conductive material, a plurality of parallel leads integrally joined to said carrier strip in predetermined spaced relation, each of said leads extending transversely of said carrier strip and having a first, proximal end adjacent said carrier strip and a second, distal end remote from said carrier strip, and first and second solder arrangements on each lead adjacent respectively to said first and second lead ends, said solder arrangements being in parallel planes spaced substantially by a distance equal to the thickness of said components, whereby upon soldering said second lead ends to the components said components may be surface-mounted on a substrate with said first solder arrangements juxtaposed to said substrate.

* * * * *